United States Patent
Takahashi et al.

(10) Patent No.: US 6,173,885 B1
(45) Date of Patent: Jan. 16, 2001

(54) METHOD FOR FORMING A BALL IN WIRE BONDING

(75) Inventors: Kuniyuki Takahashi; Tatsunari Mii, both of Musashimurayama (JP)

(73) Assignee: Kabushiki Kaisha Shinkawa, Tokyo (JP)

( * ) Notice: Under 35 U.S.C. 154(b), the term of this patent shall be extended for 0 days.

(21) Appl. No.: 09/361,085

(22) Filed: Jul. 26, 1999

(30) Foreign Application Priority Data

Jul. 27, 1998 (JP) .................................................. 10-210597

(51) Int. Cl.⁷ .......................... B23K 31/00; B23K 31/02; B23K 31/12
(52) U.S. Cl. ........................................ 228/180.5; 228/103
(58) Field of Search ................................. 228/180.5, 103, 228/4.5, 6.2, 904

(56) References Cited

U.S. PATENT DOCUMENTS

| | | | |
|---|---|---|---|
| 4,099,663 | * 7/1978 | Brill et al. | 228/159 |
| 4,912,544 | * 3/1990 | Onuki et al. | 257/771 |
| 5,897,049 | * 4/1999 | Nakamura et al. | 228/180.5 |
| 5,958,259 | * 9/1999 | Miyano et al. | 219/56.22 |
| 5,988,482 | * 11/1999 | Sasakura et al. | 228/103 |

FOREIGN PATENT DOCUMENTS 10-125714  5/1998 (JP) .
10-125715  5/1998 (JP) .

* cited by examiner

*Primary Examiner*—Patrick Ryan
*Assistant Examiner*—Zidia T. Pittman
(74) *Attorney, Agent, or Firm*—Koda & Androlia

(57) ABSTRACT

In method for forming a ball on a bonding wire, the tip end of the bonding wire that extends from a capillary is bent toward a discharge electrode, and the capillary is moved obliquely so that the tip end of the tail of the bonding wire faces the discharge electrode, and then an electric discharge is performed between the discharge electrode and the tip end of the wire, thus forming a ball on the tip end of the wire.

2 Claims, 1 Drawing Sheet

FIG. 1(a)
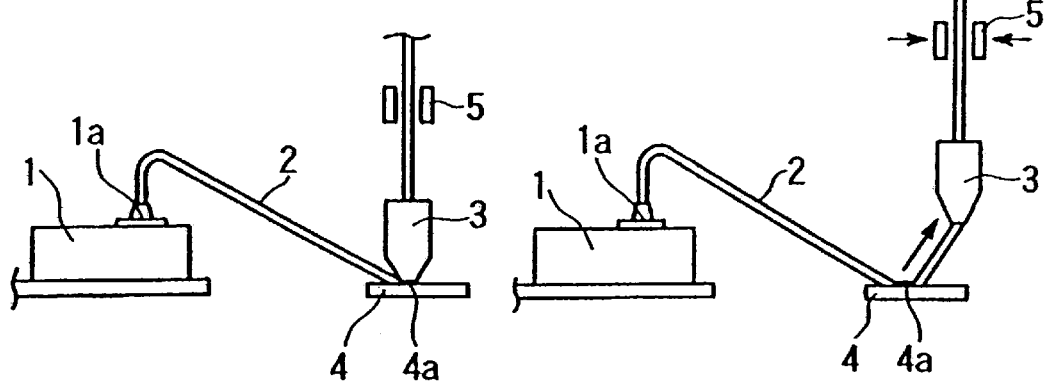
FIG. 1(b)
FIG. 1(c)
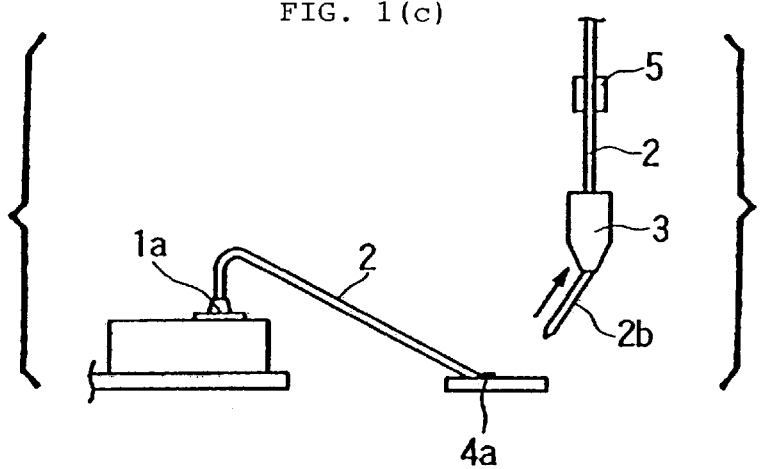
FIG. 1(d)        FIG. 1(e)
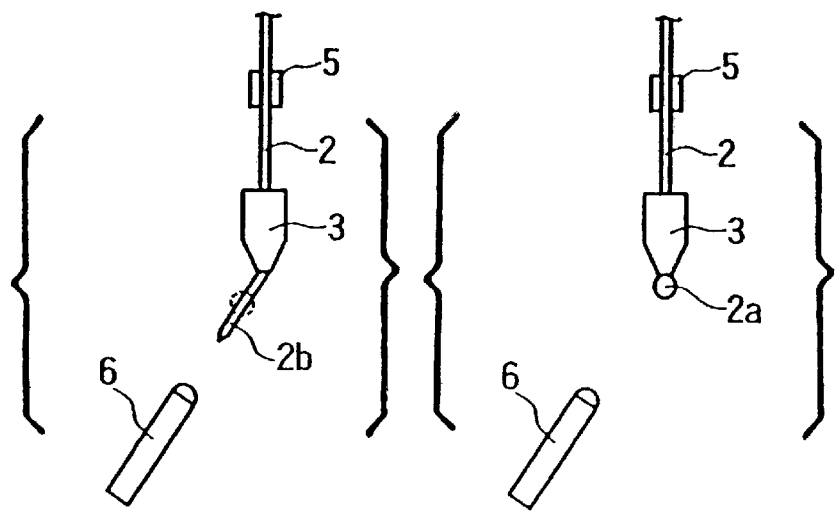

METHOD FOR FORMING A BALL IN WIRE BONDING

BACKGROUND OF THE INVENTION

1. Field of the Invention

The present invention relates to a method for forming a ball on a bonding wire and more particularly to a ball forming method in which a high voltage is applied across the tip end of a bonding wire and a discharge electrode so as to cause a discharge to take place, thus forming a ball on the tip end of the wire.

2. Prior Art

Conventionally, a fixed discharge electrode system is used for forming a ball at the end of a bonding wire. In this fixed discharge electrode system, a discharge electrode is positionally fixed. The discharge electrode is positioned as close as possible to the tip end of the wire that passes through a capillary. In addition, the discharge electrode is positioned to one side of the tip end of the wire so that the discharge electrode will not contact the capillary when the capillary is lowered.

Accordingly, in the fixed discharge electrode system, the ball is not formed when the discharge electrode is directly positioned beneath the tip end of the wire as in the case of a movable discharge electrode system. Thus, since the electric discharge is performed from the side of the wire, the ball may be distorted or an eccentric ball may be formed which deviates from the center of the wire in the direction of the wire diameter.

Japanese Patent Application Laid-Open (Kokai) No. H10-125714 (hereafter referred to as "Conventional Example 1") and Japanese Patent Application Laid-Open (Kokai) No. H10-125715 (hereafter referred to as "Conventional Example 2") disclose methods for avoiding an eccentric ball or a distorted ball in such fixed discharge electrode systems.

In Conventional Example 1, a gas is blown onto the discharge spark from the direction of the discharge electrode during ball formation, thus bending the discharge spark and causing the portion of the discharge spark that faces the wire to be positioned beneath the wire. In Conventional Example 2, a magnetic field is applied to the discharge spark, so that the portion of the discharge spark that faces the wire is bent beneath the wire.

However, Conventional Example 1 requires an auxiliary device which blows a gas onto the discharge spark, and in Conventional Example 2, an auxiliary device which applies a magnetic field to the discharge spark is required. Accordingly, both methods lead to an increase in equipment costs. Furthermore, in these prior arts, a precision control of the gas or electric field is required.

SUMMARY OF THE INVENTION

Accordingly, the object of the present invention is to provide a method for forming a ball in wire bonding which makes it possible to form a ball that does not show any distortion or deviation without any need for any auxiliary device and without performing any precision control.

It is another object of the present invention to provide a method for forming a ball which makes it possible to form the balls of a constant diameter.

The above objects are accomplished by unique steps of the present invention for a method which forms a ball at the tip end of a wire by using a discharge electrode installed on one side of the tip end of the wire that passes through a capillary and by applying a high voltage across the tip end of the wire and the discharge electrode so as to cause an electric discharge to take place; and in the present invention, the tail of the wire extending from the tip end of the capillary is bent toward the discharge electrode, the capillary is moved so that the tip end of this tail faces the discharge electrode, and an electric discharge is subsequently caused to take place from the discharge electrode so as to form the ball on the tip end of the wire.

The above objects are accomplished by further unique steps of the present invention for a method which forms a ball at the tip end of a wire by using a discharge electrode installed on one side of the tip end of the wire that passes through a capillary and by applying a high voltage across the tip end of the wire and the discharge electrode so that a discharge is caused to take place; and in the present invention:

after the wire has been bonded to the second bonding point, the capillary is raised obliquely in the opposite direction from the side on which the discharge electrode is installed, when the amount of wire delivered during this raising of the capillary reaches the length required for the formation of the ball, a clamper is closed so as to cut the wire from the root of the second bonding point, the capillary is then moved so that the tip end of the wire faces the discharge electrode, and an electric discharge is subsequently caused to take place from the discharge electrode, thus forming a ball on the tip end of the wire.

BRIEF DESCRIPTION OF THE DRAWINGS

FIGS. 1(*a*) through 1(*e*) show the method of one embodiment of the present invention.

DETAILED DESCRIPTION OF THE PREFERRED EMBODIMENTS

One embodiment of the present invention will be described with reference to FIG. 1.

In FIG. 1(*a*), after a ball 2*a* (see FIG. 1(*e*)) formed on the tip end of the wire 2 is bonded to a first bonding point 1*a* on a pellet 1, the capillary 3 is raised. Afterward, the capillary 3 is moved to a second bonding point 4*a* on a lead 4, and the wire 2 is bonded to this second bonding point 4*a*. This process has no particular connection with the feature of the present invention; and the capillary 3 is moved from the first bonding point 1*a* to the second bonding point 4*a* in accordance with any desired track.

Next, as shown in FIGS. 1(*b*) and 1(*c*), the capillary 3 and clamper 5 are obliquely raised together. At an intermediate point in this raising movement, the clamper 5 is closed when the amount of wire 2 delivered reaches the length (the length for the tail 2b shown in FIG. 1 (*d*)) that is enough for forming the ball 2*a* (see FIG. 1(*e*)) as shown in FIG. (*b*). The capillary 3 is raised further in an oblique direction, and the wire 2 is cut from the root of the second bonding point 4*a*, so that an inclined tail 2*b* is formed at the tip end of the capillary 3 as shown in FIG. 1(*c*). As shown in FIGS. 1(*b*) and 1(*c*), the direction of the oblique raising movement of the capillary 3 is the opposite direction from the side on which the discharge electrode 6 (see FIG. 1(*d*)) is installed.

Next, the capillary 3 and clamper 5 are raised, so that the tip end of the tail 2*b* is positioned so as to face the discharge electrode 6 of the fixed discharge electrode system as shown in FIG. 1(*d*). In this state, an electric discharge is performed from the discharge electrode 6 to the tip end of the tail 2*b*, so that a ball 2*a* is formed as shown in FIG. 1(*e*). In this case, since the discharge is directed toward the tip end of the tail 2*b* with a constant discharge spark angle, eccentricity and distortion of the ball 2*a* are suppressed.

As seen from the above, as a result of the tail 2*b* bent by the movement of the capillary 3 alone and the discharge spark angle being controlled, eccentricity and distortion of the ball 2*a* can be avoided. In other words, in an existing fixed discharge electrode system, a ball 2*a* which does not deviate from the axial center of the wire 2, and which shows no distortion, can be formed without any need for any auxiliary device and without performing any precision control.

According to the present invention, the tail of the wire extending from the tip end of the capillary is bent toward the discharge electrode, and the capillary is moved so that the tip end of this tail faces the discharge electrode; then, an electric discharge is performed from the discharge electrode so as to form a ball on the tip end of the wire. Accordingly, a ball free of any deviation from the axial center of the wire and free of any distortion can be formed. In addition, the diameter of the formed ball can be stabilized without any need for an auxiliary device and without performing any precision control in a fixed discharge electrode system.

What is claimed is:

1. A method for forming a ball on a wire used in wire bonding by an electric discharge between a tip end of the wire and a discharge electrode provided on one side of the tip end of the wire that passes through a capillary, wherein the method comprises the steps of:

bending a tail of the wire extending from a tip end of the capillary toward the discharge electrode, moving the capillary so that the tip end of the tail of the wire faces the discharge electrode, and causing a discharge to take place from the discharge electrode, thus forming the ball on a tip end of the wire.

2. A method for forming a ball on a wire used in wire bonding by an electric discharge between a tip end of the wire and a discharge electrode provided on one side of the tip end of the wire that passes through a capillary, wherein the method comprises the steps of:

raising the capillary obliquely in the opposite direction from the side on which the discharge electrode is installed, after the wire has been bonded to the second bonding point, closing a clamper and cutting the wire from a root of the second bonding point, when the amount of wire delivered during the raising step of the capillary reaches the length required for the formation of the ball, moving the capillary so that the tip end of the tail of the wire faces the discharge electrode, and then causing a discharge to take place from the discharge electrode, thus forming the ball on the tip end of the wire.

* * * * *